US007719456B2

(12) United States Patent
Anthony

(10) Patent No.: US 7,719,456 B2
(45) Date of Patent: May 18, 2010

(54) ANALOG ERROR CORRECTION FOR A PIPELINED CHARGE-DOMAIN A/D CONVERTER

(75) Inventor: Michael P. Anthony, Andover, MA (US)

(73) Assignee: Kenet Incorporated, Woburn, MA (US)

( * ) Notice: Subject to any disclaimer, the term of this patent is extended or adjusted under 35 U.S.C. 154(b) by 0 days.

(21) Appl. No.: 12/423,652

(22) Filed: Apr. 14, 2009

(65) Prior Publication Data

US 2009/0201184 A1 Aug. 13, 2009

Related U.S. Application Data

(63) Continuation of application No. 12/011,029, filed on Jan. 23, 2008, now Pat. No. 7,535,400.

(60) Provisional application No. 60/881,967, filed on Jan. 23, 2007.

(51) Int. Cl.
*H03M 1/12* (2006.01)
(52) U.S. Cl. ........................ 341/172; 341/162
(58) Field of Classification Search ................ 341/172, 341/162, 161; 375/316, 202, 290
See application file for complete search history.

(56) References Cited

U.S. PATENT DOCUMENTS

| | | | |
|---|---|---|---|
| 3,969,636 | A | 7/1976 | Baertsch et al. |
| 4,072,938 | A | 2/1978 | Buchanan |
| 4,138,665 | A | 2/1979 | Eichelberger et al. |
| 4,159,430 | A | 6/1979 | Boudewijns et al. |
| 4,224,585 | A | 9/1980 | Tanaka |
| 4,471,341 | A | 9/1984 | Sauer |
| 4,538,287 | A | 8/1985 | Roberts et al. |
| 4,636,985 | A | 1/1987 | Aoki et al. |
| 4,660,064 | A | 4/1987 | Hamasaki |
| 4,716,580 | A | 12/1987 | Berger |

(Continued)

FOREIGN PATENT DOCUMENTS

JP 59000963 A 1/1984

(Continued)

OTHER PUBLICATIONS

Frey, W., "Bucket-Brigade Device with Improved Charge Transfer," *Electronic Letters*, 9: 588-589 (Dec. 13, 1973).

(Continued)

*Primary Examiner*—Jean B Jeanglaude
*Assistant Examiner*—Joseph Lauture
(74) *Attorney, Agent, or Firm*—Hamilton, Brook, Smith & Reynolds, P.C.

(57) ABSTRACT

A technique for correcting errors in Bucket Brigade Device (BBD)-based pipelined devices, such as Analog-to Digital Converters (ADCs). The gain between pipeline stages is desired to be a specific amount, such as unity: that is, all net charge present in each stage ideally is transferred to the next stage. In practical BBD-based circuits, however, the charge-transfer gain is less than ideal, resulting in errors. The approach described herein provides analog correction of such errors due to both capacitor mismatch and to sub-unity charge-transfer gain. In certain embodiments the adjustment circuit may use an adjustable current source and Field Effect Transistor to introduce the correction. In still other embodiments, the adjustment circuit may determine a voltage-feedback coefficient.

20 Claims, 9 Drawing Sheets

U.S. PATENT DOCUMENTS

| | | | |
|---|---|---|---|
| 4,890,307 | A | 12/1989 | Imai et al. |
| 4,984,256 | A | 1/1991 | Imai |
| 4,987,580 | A | 1/1991 | Pelgrom et al. |
| 5,149,954 | A | 9/1992 | Pettijohn et al. |
| 5,276,723 | A | 1/1994 | Miwada |
| 5,291,083 | A | 3/1994 | Blalock et al. |
| 5,339,275 | A | 8/1994 | Hyatt |
| 5,349,303 | A | 9/1994 | Gerpheide |
| 5,506,525 | A | 4/1996 | Debroux |
| 5,671,252 | A * | 9/1997 | Kovacs et al. .............. 375/316 |
| 5,693,968 | A | 12/1997 | Cherry et al. |
| 6,137,344 | A | 10/2000 | Miki |
| 6,150,851 | A | 11/2000 | Ohmi et al. |
| 6,249,181 | B1 | 6/2001 | Marble |
| 6,356,148 | B1 | 3/2002 | Marble |
| 6,510,193 | B1 | 1/2003 | Kochi et al. |
| 6,566,943 | B1 | 5/2003 | Marble |
| 6,600,513 | B1 | 7/2003 | Ozumi |
| 6,751,141 | B1 | 6/2004 | Alvandpour et al. |
| 6,867,718 | B2 | 3/2005 | Cesura et al. |
| 6,972,707 | B1 | 12/2005 | Anthony |
| 2001/0019361 | A1 | 9/2001 | Savoye |
| 2004/0160351 | A1 | 8/2004 | Rossi |
| 2005/0151679 | A1 | 7/2005 | Adams |

FOREIGN PATENT DOCUMENTS

| | | |
|---|---|---|
| JP | 03001548 A | 1/1991 |

OTHER PUBLICATIONS

Jespers, Paul G. A., et al., "A Fast Sample and Hold Charge-Sensing Circuit for Photodiode Arrays," *IEEE J. of Solid-State Circuits*, SC-12(3): 232-237 (Jun. 1977).

Maria del Mar Hershenson, "Design of pipeline analog-to-digital converters via geometric programming, IEEE," (2002).

Feb. 23, 2009, Notice of Allowance and Fee(s) Due, U.S. Appl. No. 12/022,029.

Notice of Allowance, date of mailing, Apr. 8, 2009.

Notification of Transmittal of International Preliminary Report on Patentability dated Dec. 15, 2009, with copy of International Preliminary Report on Patentability, issued in PCT Application No. PCT/US08/00825 (7 pages).

* cited by examiner

ANALOG ERROR CORRECTION FOR A PIPELINED CHARGE-DOMAIN A/D CONVERTER

RELATED APPLICATION(S)

This application is a Continuation application of U.S. patent application Ser. No. 12/011,029, filed on Jan. 23, 2008, now U.S. Pat. No. 7,535,400 which claims the benefit of U.S. Provisional Application No. 60/881,967, filed on Jan. 23, 2007. The entire teachings of the above application(s) are incorporated herein by reference.

BACKGROUND OF THE INVENTION

In charge-domain signal-processing circuits, signals are represented as charge packets. These charge packets are stored, transferred from one storage location to another, and otherwise processed to carry out specific signal-processing functions. Charge packets are capable of representing analog quantities, with the charge-packet size in coulombs being proportional to the signal represented. Charge-domain operations such as charge-transfer are driven by 'clock' voltages, providing discrete-time processing. Thus, charge-domain circuits provide analog, discrete-time signal-processing capability. This capability is well-suited to performing analog-to-digital conversion using pipeline algorithms.

Charge-domain circuits are implemented as charge-coupled devices (CCDs), as MOS bucket-brigade devices (BBDs), and as bipolar BBDs. The present invention pertains to MOS BBDs.

Pipelined analog-to-digital converters (ADCs) are well-known in the general field of ADC design. They are widely used in applications in which high sample rates and high resolution must be combined. Pipelined ADCs implement the well-known successive-approximation analog-to-digital (A/D) conversion algorithm, in which progressively-refined estimates of an input signal are made at sequential times. In pipelined versions of this algorithm, one or several bits are resolved at each pipeline stage, the quantized estimate is subtracted from the signal, and the residue is propagated to the next pipeline stage for further processing. Pipelined ADCs have been implemented using a variety of circuit techniques, including switched-capacitor circuits and charge-domain circuits. The present invention pertains to charge-domain pipelined ADCs employing MOS BBDs.

SUMMARY OF THE INVENTION

In BBD-based pipelined ADCs, the gain between pipeline stages is nominally unity: that is, all net charge present in each stage ideally is transferred to the next stage. In practical BBD-based circuits, however, the charge-transfer gain is less than unity, resulting in errors in the A/D conversion process. Moreover, in all pipelined ADCs including those employing BBDs, mismatch of capacitors and of capacitor ratios causes such errors.

The present invention corrects for errors in BBD-based pipelined ADCs due to both capacitor mismatch and to sub-unity charge-transfer gain. Circuits that implement this correction are compact and temperature-stable, and consume low power.

In a preferred embodiment, a pipelined charge domain circuit using bucket brigade charge transfer comprises a first charge transfer circuit; a second charge transfer circuit; and a node coupled to the first charge transfer circuit and the second charge transfer circuit. A clocked capacitor is coupled to the node and to a clocked voltage. Furthermore, a conditionally-switched capacitor is also coupled to the node, with the conditionally-switched capacitor driven by a transition voltage. An adjustment circuit is provided for adjusting the transition voltage according to conditions detected within the pipelined charge domain circuit.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

The teachings of all patents, published applications and references cited herein are incorporated by reference in their entirety.

In the following description, all circuits are discussed assuming electrons as the signal-charge carriers and NFETs for signal-charge transfer. Functionally equivalent circuits can be applied equally well using holes as charge carriers, by employing PFETs and reversed signal and control voltage polarities. In the discussion and figures, charge-transfer circuits are represented abstractly and the relevant behavioral aspects of these circuits are described, but in some instances, specific details of the operation of such circuits are understood by those of skill in the art and/or are not relevant to the invention claimed herein, and thus are not provided. The issue of sub-unity charge transfer gain is common to all known charge-transfer circuits.

Figure 1:
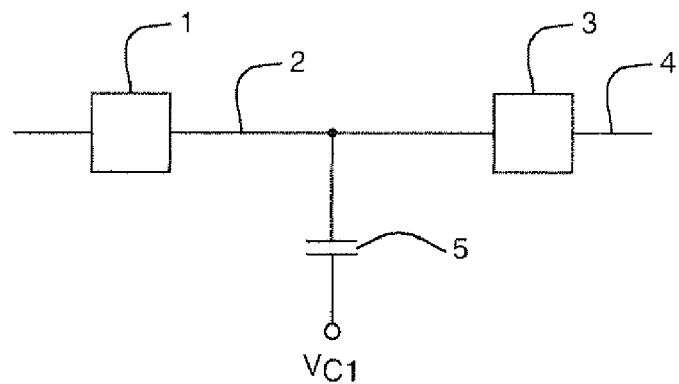
FIG. 1 shows a simplified circuit diagram of a BBD charge-pipeline stage.

The basic principle of a BBD pipeline of the general type employed in a preferred embodiment of this invention is described with the aid of FIG. 1, which depicts a single stage of such a pipeline. In this stage charge is stored on capacitor 5, which is connected between storage node 2 and voltage $V_{C1}$. Charge enters the stage via charge-transfer circuit 1, and later exits the stage via charge-transfer circuit 3. Voltage $V_{C1}$ is a digital clock signal which controls the timing of charge processing in the stage. Other digital clock signals, not shown, may be used to control the activity of the charge-transfer circuits.

Figure 2:
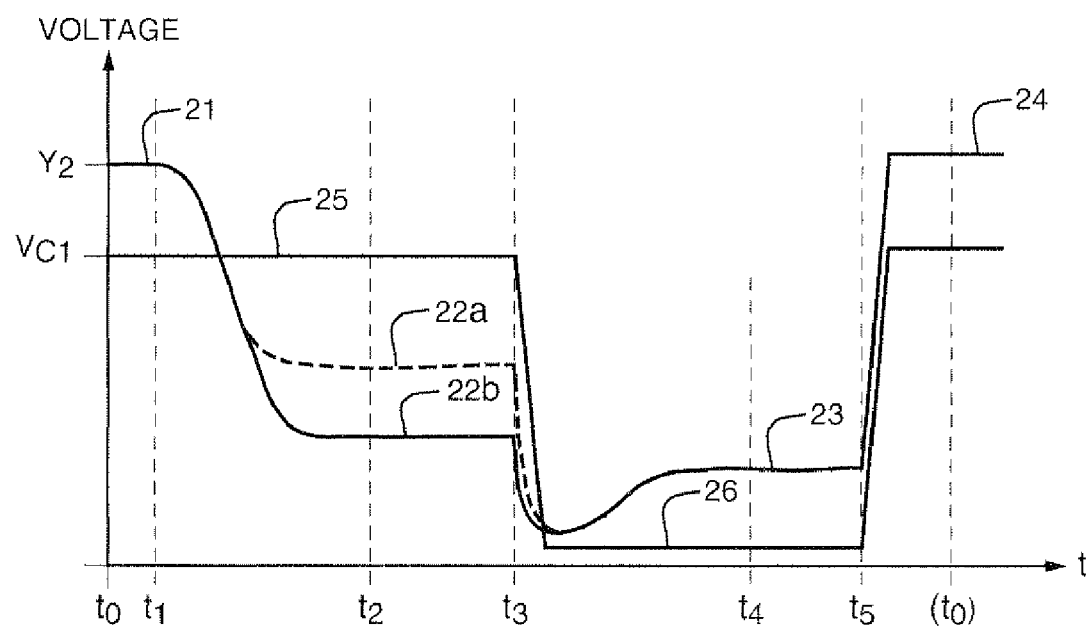
FIG. 2 illustrates voltage waveforms associated with FIG. 1.

Operating waveforms of the pipeline stage are shown in FIG. 2. At time t0 clock voltage $V_{C1}$ has a positive value 25. $V_2$, the voltage of storage-node 2 in FIG. 1, is also at a high initial voltage 21. At $t_1$ negative charge begins to be transferred from the previous stage (to the left of FIG. 1) via charge-transfer circuit 1 into the stage shown. As this negative charge accumulates on capacitor 5, $V_2$ falls to a more negative value. The voltage of node 2 settles to a relatively high value 22A if a relatively small negative charge was transferred; with a larger charge transferred, node 2 settles to a more negative voltage 22B. At time $t_2$ charge transfer into the stage is complete. The voltage of node 2 is related to the charge by the well-known expression Q=CV, where C is the total capacitance of node 2. In FIG. 1, C is comprised of $C_5$, the capacitance of capacitor 5, plus any parasitic capacitance of node 2; such parasitic capacitance is usually small and is neglected in this discussion.

Charge transfer out of the stage begins at time $t_3$ when clock voltage $V_{C1}$ switches to a low state. Capacitor 5 couples this voltage transition to node 2, driving $V_2$ low as well. Charge-transfer circuit 3 absorbs charge from capacitor 5, limiting the negative excursion of node 2, and eventually causing node 2 to settle to voltage 23 at $t_4$. Voltage 23 is a characteristic of charge-transfer circuit 3, and is independent of the amount of charge which had been stored on node 2. Charge-transfer circuit 3 transfers the charge absorbed from capacitor 5 to node 4 which is part of the stage following the one shown. After $t_4$ charge transfer is complete.

Finally, at time $t_5$, clock voltage $V_{C1}$ returns to its initial state (voltage 25). Its positive-going transition is coupled to node 2 by capacitor 5, raising node 2 to voltage 24. Neglecting parasitic capacitance, no charge flows onto or off of node 2 during this transition; the voltage change of $V_2$ is therefore equal to the voltage change of $V_{C1}$ during the transition at $t_5$. Since $V_2$'s value at the start of this transition, voltage 23, is independent of charge processed, voltage 24 is likewise independent of charge processed. This transition completes the operating cycle; the resulting voltage 24 at node 2 is thus the initial voltage for the next cycle. Thus the initial voltage state of the stage is constant cycle-to-cycle, and voltage 21=voltage 24. Consequently the initial and final charge on node 2 are also equal, and the charge transferred out is equal to the charge transferred in.

In summary: charge is transferred into the stage shown in FIG. 1 during $t_1$-$t_2$; between times $t_2$ and $t_3$ it is temporarily stored on capacitor 5, and is manifested as the value of $V_2$; during times $t_3$-$t_4$ this charge is completely transferred to the next stage; at $t_5$ the stage returns to its initial state, ready again to receive incoming charge. Thus the basic stage shown acts as a shift register for analog charge packets.

The foregoing description is somewhat idealized; it should be understood that practical circuits depart in many details from this description. Such departures include non-zero parasitic capacitance and imperfect charge transfer, for example. These effects, however, do not change the basic operating principles described above. Certain details of circuit operation, such as clocking of the charge-transfer circuits, are also omitted, as they are not pertinent to the present invention.

In order to form a charge-domain ADC from a pipeline composed of stages similar to FIG. 1, a minimum of two operations in addition to charge storage and shifting are required: charges must be compared to a reference value, typically another charge; and a reference charge must be conditionally added to the signal charge (this 'addition' may be of either sign). In a previous patent application by the same inventor entitled "Charge-Domain Pipelined Analog-to-Digital Converter" filed on Jan. 18, 2008 and given Ser. No. 12/009,615, which itself claims priority an earlier filed provisional application of the same title filed on Jan. 19, 2007 and given provisional application Ser. No. 60/881,392, both of which are hereby incorporated by reference in their entirety, an ADC is disclosed which implements pipelined successive-approximation ADC algorithms using these operations. The present invention provides a way to improve the accuracy of charge-transfer and conditional-charge addition in such an ADC. For purposes of understanding the present invention, the charge-comparison aspects of ADC implementation are not important, and are not discussed further. Conditional charge addition is essential for such understanding, however, and is explained with reference to FIGS. 3 and 4 below.

Figure 3:
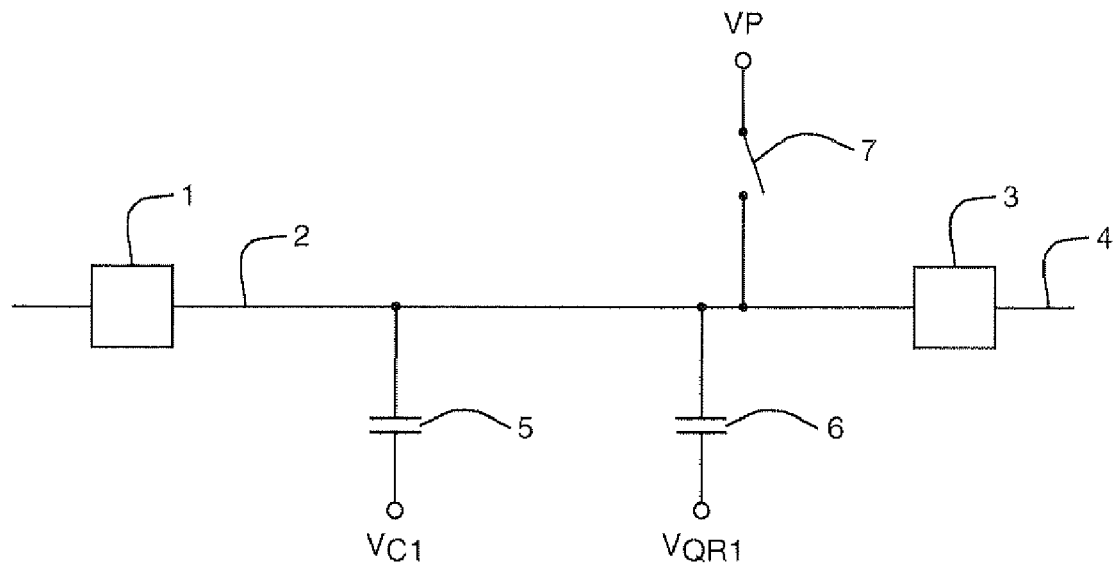
FIG. 3 shows a BBD charge-pipeline stage including conditional charge addition.
Figure 4:
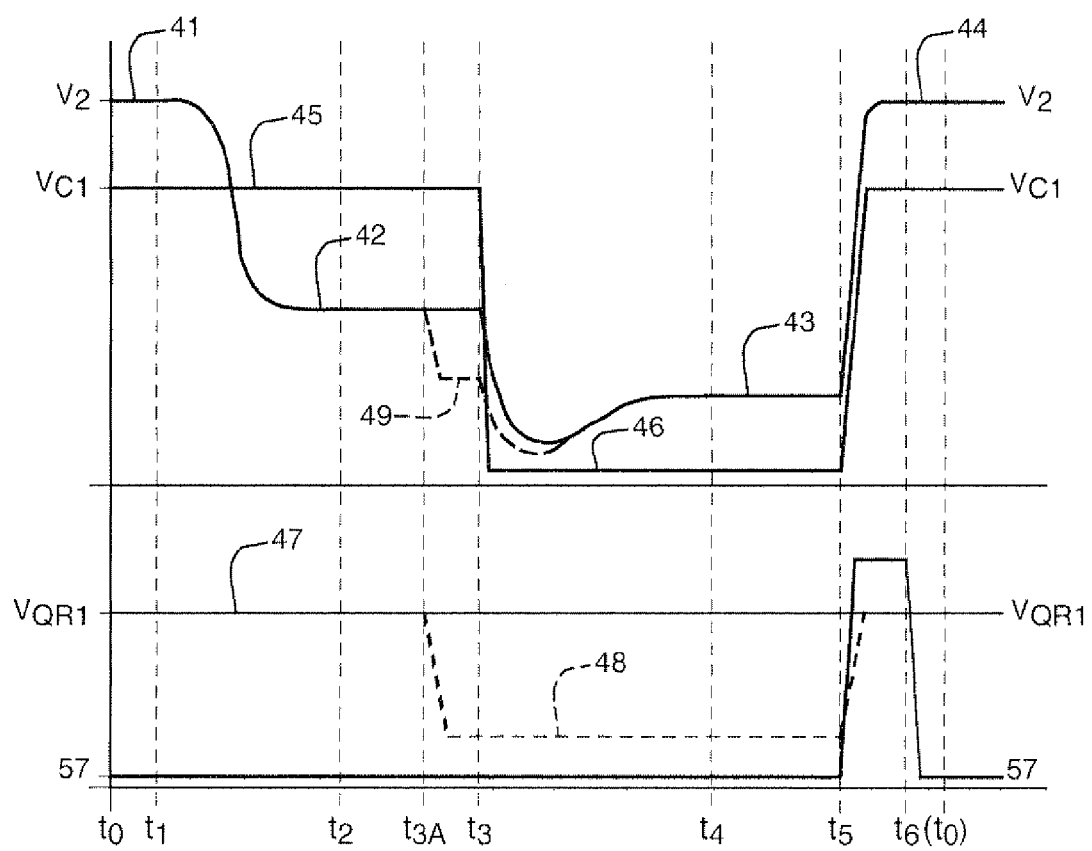
FIG. 4 illustrates voltage waveforms associated with FIG. 3.

The basic principle employed for conditional charge addition is depicted in FIG. 3, with operating waveforms shown in FIG. 4. For the purposes of this discussion, a single-ended stage is shown. In practical ADC designs, differential operation is usually preferred; the present invention is applicable to both single-ended and differential pipeline circuits. More details of the implementation of a differential pipeline stage are shown and described in the aforementioned "Charge-Domain Pipelined Analog-to-Digital Converter" patent application.

The pipeline stage shown in FIG. 3 retains all the elements shown in FIG. 1. In addition, FIG. 3 includes two new elements: capacitor 6 (with value $C_6$) connected between charge-storage node 2 and voltage $V_{QR1}$; and switch 7 connected between node 2 and voltage $V_P$. Switch 7 is controlled by a periodic digital clock signal (identified as $S_7$ in FIG. 4).

FIG. 4 shows the operating waveforms of the circuit of FIG. 3. The initial conditions in FIG. 4 are similar to those in FIG. 2: $V_{C1}$ is at high voltage 45 and $V_2$, the voltage of node 2, is at high voltage 41. In addition, $V_{QR1}$ is at high voltage 47, and switch 7 is in an off state, indicated by the low value of its control signal $S_7$ in FIG. 4. As in FIG. 2, charge is transferred into the stage between $t_1$ and $t_2$, causing $V_2$ to fall in proportion to the incoming charge, settling at voltage 42. The change in $V_2$ due to incoming charge is inversely proportional to the total capacitance of node 2 as explained above. In FIG. 3 (neglecting parasitic capacitance) this total capacitance is $C=C_5+C_6$.

After the charge is transferred in, the new features of FIG. 3 come into play. At time $t_{3A}$ voltage $V_{QR1}$ conditionally switches from its high state 47 to low state 48. This conditional transition of $V_{QR1}$ is coupled via $C_6$ to node 2 where, because of capacitive division, it produces a similar but smaller voltage change. The voltage at node 2 changes to voltage 49 (dashed line) if $V_{QR1}$ switches, and remains at voltage 42 (solid line) if it does not.

At time $t_3$, $V_{C1}$ switches from high voltage 45 to low voltage 46, instigating charge transfer out of the stage. As explained with reference to FIG. 2, node 2 is driven to a lower voltage due to coupling via capacitor 5. Charge-transfer circuit 3 removes charge from node 2 and transfers it to the next stage. By $t_4$ $V_2$ settles to voltage 43 which is independent of the charge previously on node 2, and charge transfer out of the stage is complete.

At $t_5$ both $V_{C1}$ and $V_{QR1}$ return to their initial high states (voltages 45 and 47 respectively). This transition is identical for $V_{C1}$ in every clock cycle. $V_{QR1}$, however, may already be at its high voltage 47, depending on whether or not it switched at $t_{3A}$. Thus the positive step coupled to node 2 at $t_5$ can have different values, depending on the state of $V_{QR1}$, resulting in a different final voltage. The added switch 7 in FIG. 3 is used to restore the voltage (and charge) on node 2 to a repeatable state regardless of the state of $V_{QR1}$ at $t_5$. Switch 7 is turned on, as indicated by the high state of its control signal S7, during $t_5$-$t_6$, thus establishing a repeatable voltage at node 2 to begin the next cycle, so voltage 44=voltage 41. With an ideal switch, voltage 44=$V_P$; practical MOS switches introduce a small 'pedestal' so that voltage 44≠$V_P$. This non-ideality is, however, repeatable cycle-to-cycle, so the voltage 44=voltage 41 condition is still met in practical circuits.

Unlike the case of FIG. 1 where the charge transferred into the stage was subsequently transferred out without alteration, the outgoing charge in the circuit of FIG. 3 differs in general from the incoming charge:

$$Q_{OUT}=Q_{IN}+C_6\Delta V_{QR1}+Q_{CONST} \qquad \text{Equation 1}$$

where $C_6$ is the capacitance of capacitor 6, $\Delta V_{QR1}$ is the change in $V_{QR1}$ at $t_{3A}$, and $Q_{CONST}$ is given by:

$$Q_{CONST}=(C_5+C_6)(\text{voltage 41}-\text{voltage 43})+C_5(\text{voltage 46}-\text{voltage 45}) \qquad \text{Equation 1A}$$

$Q_{CONST}$ is nominally a fixed charge, since voltages 41, 43, 45, and 46 are all ideally constant. Departures from this ideal case, which constitute one source of charge-transfer imperfection, will be discussed below.

As is apparent in FIG. 4, $\Delta V_{QR1}$ is equal to (voltage 48–voltage 47) if $V_{QR1}$ switches, and is equal to zero if it does not. Note that both charge quantities $C_6\Delta V_{QR1}$ and $Q_{CONST}$ can be made either positive or negative by appropriate choices of the various voltages.

When the circuit of FIG. 3 is used to form one stage of a pipelined ADC, the quantity (voltage 48–voltage 47) is made equal to a reference voltage; for convenience it will be called $V_{R1}$. Correspondingly, the quantity $C_6V_{R1}$ becomes a reference charge, since $C_6$ is fixed in a given instantiation. Thus the conditional choice of $\Delta V_{QR1}=V_{R1}$ or $\Delta V_{QR1}=0$ at $t_{3A}$ corresponds in Equation 1 to the conditional addition of a reference charge $C_6V_{R1}$ to the incoming charge packet $Q_{IN}$. The circuit of FIG. 3 thus provides one of the two operations required for a charge-domain ADC implementation.

Note that the exact position of time $t_{3A}$ is not critical to the operation of the circuit of FIG. 3. The conditional transition of $V_{QR1}$ can occur at any time between $t_0$ and $t_3$ with no change in circuit performance; under some practicable conditions it may also occur in the $t_3$-$t_4$ interval.

Figure 5:
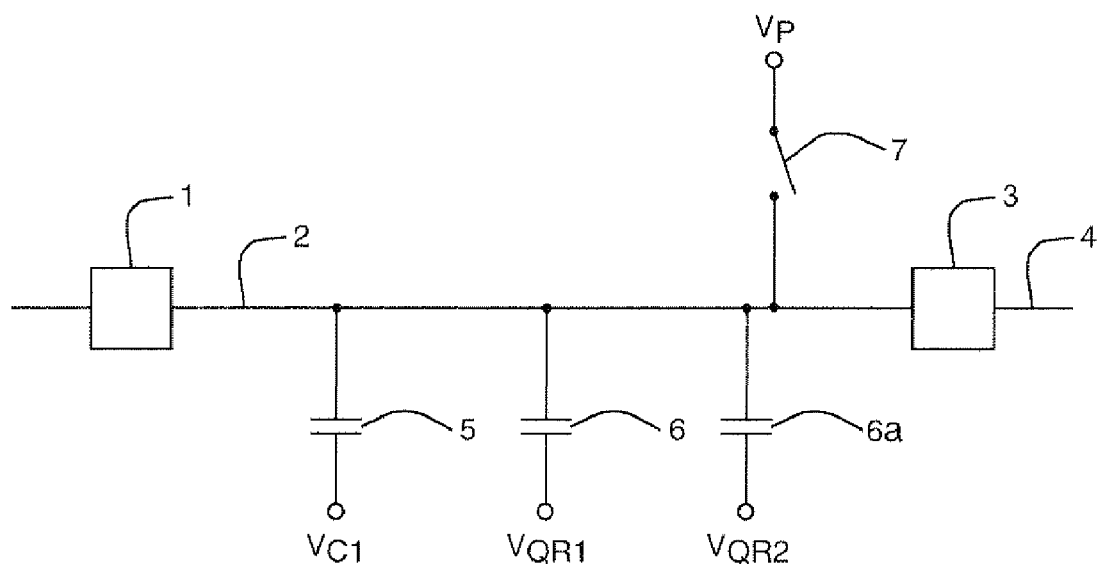
FIG. 5 shows a BBD charge-pipeline stage including conditional charge addition, with the added charge composed of two independent components.

In some ADC implementations it is desirable to provide more than one conditional charge addition in a single pipeline stage. An example of such a stage is shown in FIG. 5. This circuit includes, in addition to the elements in FIG. 3, additional capacitor 6A and voltage source $V_{QR2}$. The operation of such a stage is identical to that of FIG. 3, except that at $t_{3A}$ each of the voltages $V_{QR1}$ and $V_{QR2}$ undergoes an independent conditional transition, of size $V_{R1}$ and $V_{R2}$ (or zero) respectively. The resulting charge transfer function of the stage is given by:

$$Q_{OUT}=Q_{IN}+C_6\Delta V_{QR1}+C_{6A}\Delta V_{QR2}+Q_{CONST2} \qquad \text{Equation 2}$$

where $Q_{CONST2}$ is given by:

$$Q_{CONST2}=(C_5+C_6+C_{6A})(\text{voltage 41}-\text{voltage 43})+C_5(\text{voltage 46}-\text{voltage 45}) \qquad \text{Equation 2A}$$

The same principle can be extended to any number of capacitors and $V_R$ values. For simplicity Equations 1 and 1A will be used as the basis for the following discussion. The principles described are equally applicable to circuits with more than one conditionally-switched capacitor, as in FIG. 5.

Two idealizations included in the discussion above are, in general, imperfectly realized in practical circuits: first, because of tolerances in manufacturing, conditionally-switched capacitors such as $C_6$ generally do not have precisely the intended values; second, the final voltage to which the floating diffusion 2 settles (voltage 43 in FIG. 4, for example) is in general not perfectly independent of $Q_{OUT}$. The effects of these non-idealities are considered in detail below, beginning with the dependence of voltage 43 on $Q_{OUT}$.

Considering a first-order (linear) dependence of voltage 43 upon $Q_{OUT}$, the value of voltage 43 can be written $v_{43}=v_{43N}+kQ_{OUT}$, where $v_{43}$ is the actual value of voltage 43, $v_{23N}$ is the nominal value, and k is a coefficient embodying the linear dependence on $Q_{OUT}$. Using this expression for voltage 43 in Equation 1A yields:

$$\begin{aligned}Q_{CONST} &= (C_5+C_6)(\text{voltage 41}-v_{43N}-kQ_{OUT})+ \\ &\quad C_5(\text{voltage 46}-\text{voltage 45}) \\ &= (C_5+C_6)(\text{voltage 41}-v_{43N})+ \\ &\quad C_5(\text{voltage 46}-\text{voltage 45})- \\ &\quad (C_5+C_6)kQ_{OUT} \\ &= Q_{CC}-(C_5+C_6)kQ_{OUT}\end{aligned} \qquad \text{Equation 3}$$

where $Q_{CC}$ is the $Q_{OUT}$-independent (i.e., constant) component of $Q_{CONST}$. Replacing $Q_{CONST}$ in Equation 1 with the expression given by Equation 3, we obtain:

$$Q_{OUT}=Q_{IN}+C_6\Delta V_{QR1}+Q_{CC}-(C_5+C_6)kQ_{OUT} \qquad \text{Equation 4}$$

Turning now to the fabrication errors in $C_6$, we can write $C_6=C_{6N}+C_{6E}$, where $C_{6N}$ is the nominal value of $C_6$, and $C_{6E}$ is the deviation from nominal. Substituting this expression into Equation 4 yields:

$$Q_{OUT}=Q_{IN}+C_{6N}\Delta V_{QR1}+C_{6E}\Delta V_{QR1}+Q_{CC}-(C_5+C_6)kQ_{OUT} \qquad \text{Equation 5}$$

In fractional terms, the errors expressed in Equation 5 are $C_{6E}/C_{6N}$ and $(C_5+C_6)k$, both of which are dimensionless quantities. In practical designs these fractional errors are small (i.e., <<1). Thus we can find a practically-useful approximation to Equation 5 by replacing $Q_{OUT}$ in the last term with the full expression given by Equation 5, and then omitting second-order error effects (i.e., terms including squares or products of the fractional errors). Defining $\epsilon=(C_5+C_6)k$ and carrying out this procedure, we obtain:

$$Q_{OUT}=Q_{IN}(1-\epsilon)+C_{6N}\Delta V_{QR1}(1-\epsilon)+Q_{CC}(1-\epsilon)+C_{6E}\Delta V_{QR1} \qquad \text{Equation 6}$$

Comparing this expression to the idealized expression of Equation 1, it is apparent that the quantity $(1-\epsilon)$ is an effective charge-transfer gain; $\epsilon$ is the amount by which that gain falls short of unity. The term $C_{6E}\Delta V_{QR1}$ embodies the effect of fabrication error in $C_6$.

A pipelined charge-domain ADC is composed of multiple stages like that of FIG. 3, in which reference charges are conditionally added and subsequently transferred down the pipeline. (As mentioned above, some architectures employ multiple conditional charges per stage.) Equation 6 expresses the output charge of each such stage in terms of that stage's input charge and its conditional capacitor switching. At any stage of the pipeline, the input charge is the sum of the signal-charge input to the pipeline and the cumulative changes due to up-stream pipeline stages according to Equation 6.

Figure 6:
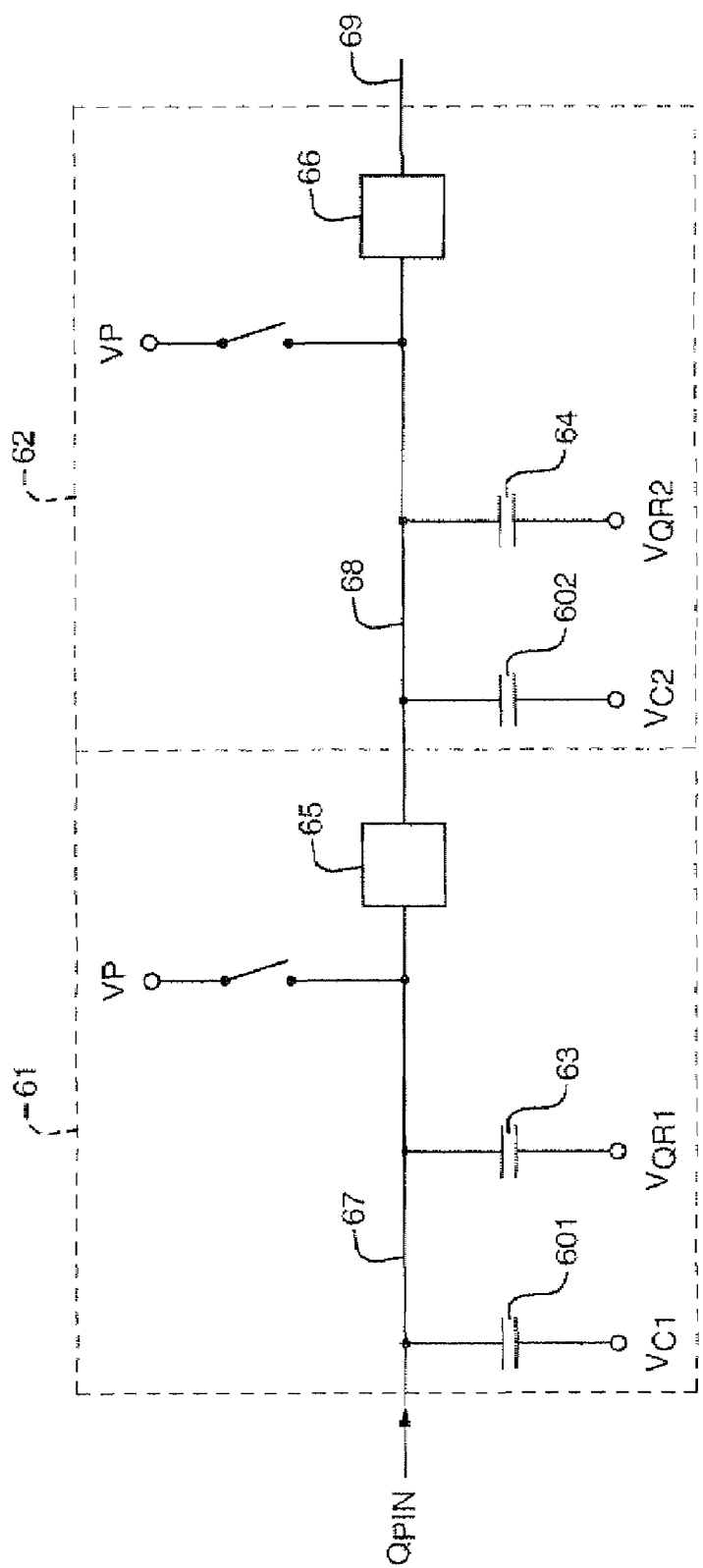
FIG. 6 shows a two-stage pipeline segment composed of stages like that of FIG. 3.

Consider for example the two-stage pipeline segment shown in FIG. 6, which is composed of stages like that in FIG. 3. The two stages, 61 and 62, each consist of a storage node (67 and 68 respectively), a charge-transfer circuit (65 and 66 respectively), a conditionally-switched capacitor (63 and 64 respectively), a clocked capacitor (601 and 602), and a pre-charge switch $V_P$. The input charge to the pipeline segment, $Q_{PIN}$, is supplied to storage node 67 of stage 61 as indicated. The output of this pipeline segment (which is the output charge of stage 62) appears at node 69. The conditionally-switched voltages driving capacitors 63 and 64 are $V_{QR1}$ and $V_{QR2}$ respectively. They can each independently be switched, with a step-size of 0 or $V_{R1}$ and 0 or $V_{R2}$ respectively, where $V_{R1}$ and $V_{R2}$ are reference voltages.

Such a pipeline operates in two-phases: alternating stages operate on alternating half-cycles of the clock. In the circuit of FIG. 6, for example, charge is transferred into stage 61 and out of stage 62 on the first half-cycle, and is transferred out of stage 61 and into stage 62 on the second half-cycle. Details of this clocking method are not germane to the subject of the present invention, and are not treated further.

The input charge to stage 62 in FIG. 6 is the output charge from stage 61. Thus, with the input charge to stage 61 equal to $Q_{PIN}$, the output charge from stage 62 can be derived by applying Equation 6 twice:

$$Q_{OUT62} = Q_{IN62}(1-\varepsilon) + C_{64N}\Delta V_{QR2}(1-\varepsilon) + \quad \text{Equation 7}$$
$$Q_{CC}(1-\varepsilon) + C_{64E}\Delta V_{QR2}$$
$$= \begin{bmatrix} Q_{PIN}(1-\varepsilon) + \\ C_{63N}\Delta V_{QR1}(1-\varepsilon) + \\ Q_{CC}(1-\varepsilon) + C_{63E}\Delta V_{QR1} \end{bmatrix}(1-\varepsilon) +$$
$$C_{64N}\Delta V_{QR2}(1-\varepsilon) + Q_{CC}(1-\varepsilon) + C_{64E}\Delta V_{QR2}$$
$$= Q_{PIN}(1-\varepsilon)^2 + C_{63N}\Delta V_{QR1}(1-\varepsilon)^2 +$$
$$C_{64N}\Delta V_{QR2}(1-\varepsilon) + C_{63E}\Delta V_{QR1}(1-\varepsilon) +$$
$$C_{64E}\Delta V_{QR2} + [(1-\varepsilon)^2 + (1-\varepsilon)]Q_{CC}$$

This expression can be simplified by omitting second-order error terms as was done above, giving:

$$Q_{OUT62} = Q_{PIN}(1-2\varepsilon) + C_{63N}\Delta V_{QR1}(1-2\varepsilon) + \quad \text{Equation 8}$$
$$C_{64N}\Delta V_{QR2}(1-\varepsilon) + C_{63E}\Delta V_{QR1} +$$
$$C_{64E}\Delta V_{QR2} + (2-3\varepsilon)Q_{CC}$$

Equation 8 shows the cumulative effect of charge-transfer gain and capacitor errors in a two-stage pipeline. The same analysis can be extended to multiple stages and to multiple conditionally-switched capacitors per stage.

In order for a pipelined charge-domain ADC to produce linear results, it is essential that the conditionally-added charges from each stage appear at the end of the ADC pipeline with a specific ratio. In the Equation 8 the (non-zero) values of the conditionally-added charges are nominally $C_{63N}V_{R1}$ and $C_{64N}V_{R2}$ in the first and second stages respectively. According to equation 8 then, the conditionally-added charge values, as they appear at the pipeline output, are:

$[C_{63N}V_{R1}(1-2\varepsilon)+C_{63E}V_{R1}]$ from the first stage, and $[C_{64N}V_{R2}(1-\varepsilon)+C_{64E}V_{R2}]$ from the second stage.

Thus the ADC linearity requirement can be expressed as:

$$[C_{63N}V_{R1}(1-2\varepsilon)+C_{63E}V_{R1}]/[C_{64N}V_{R2}(1-\varepsilon)+C_{64E}V_{R2}]$$
$$=K \quad \text{Equation 9}$$

where K is the intended ratio. In an ideal pipeline segment, in which the charge-transfer and capacitor errors are zero, Equation 9 is simplified to:

$$(C_{63N}V_{R1})/(C_{64N}V_{R2})=K \quad \text{Equation 10}$$

The effects of non-zero gain error $\varepsilon$ and capacitor errors such as $C_{63E}$ are evident when Equation 9 is compared to Equation 10.

One aspect of the present invention provides a way to satisfy Equation 9 when these errors have non-zero values. This can consist of providing an adjustment to the reference voltages $V_{R1}$ and $V_{R2}$. The nominal capacitance values $C_{63N}$ and $C_{64N}$ and the reference voltages $V_{R1}$ and $V_{R2}$ are chosen to satisfy Equation 10; then independently adjustable voltages $V_{A1}$ and $V_{A2}$ are added to $V_{R1}$ and $V_{R2}$. With this change, and again omitting second-order error terms, the upper and lower terms in the ratio of Equation 9 become:

$$[C_{63N}V_{R1}(1-2\varepsilon) + C_{63E}V_{R1}] \rightarrow [C_{63N}(V_{R1}+V_{A1})(1-2\varepsilon) + C_{63E}V_{R1}] =$$
$$[C_{63N}V_{R1}(1-\varepsilon) - \varepsilon C_{63N}V_{R1} + C_{63E}V_{R1} + C_{63N}V_{A1}]$$

and $$[C_{64N}V_{R2}(1-\varepsilon) + C_{64E}V_{R2}] \rightarrow$$
$$[C_{64N}(V_{R2}+V_{A2})(1-\varepsilon) + C_{64E}V_{R2}] =$$
$$[C_{64N}V_{R2}(1-\varepsilon) + C_{64E}V_{R2} + C_{64N}V_{A2}]$$

The added voltages are now adjusted to force the ratio of the adjusted bracketed terms to equal K. For example, setting:

$$V_{A1}=[\varepsilon-(C_{63E}/C_{63N})]V_{R1} \quad \text{Equation 11A}$$

and $$V_{A2}=-(C_{64E}/C_{64N})V_{R2} \quad \text{Equation 11B}$$

results in the desired ratio. With this solution, $V_{A2}$ is adjusted to correct for the error of capacitor 64 and $V_{A1}$ is adjusted to compensate both for the error of capacitor 63 and for the charge-transfer gain $\varepsilon$.

An alternative adjustment is:

$$V_{A1}=(C_{63E}/C_{63N})V_{R1} \quad \text{Equation 12A}$$

and $$V_{A2}=[-\varepsilon-(C_{64E}/C_{64N})]V_{R2} \quad \text{Equation 12B}$$

which also results in the desired ratio. With this solution, $V_{A1}$ is adjusted to correct for the error of capacitor 63 and $V_{A2}$ is adjusted to compensate both for the error of capacitor 63 and for the charge-transfer gain $\varepsilon$. Both solutions 11A/B and 12A/B are useful. Any linear combination of these solutions can be used with the same result.

This same adjustment principle can be applied in a pipeline with any number of stages. It can also be applied in an ADC design with more than one conditionally-added charge per stage (as in the example of FIG. 5). In these cases, a separate adjustment voltage ($V_A$) is applied to the reference voltage for each conditionally-switched capacitor. With the adjustment method of Equation 12A/B, for example, each such adjustment corrects for the combination of that individual capacitor's error and the total charge-transfer errors of all previous stages. In some designs, the charge-transfer error is not identical from stage to stage, but this adjustment method intrinsically accommodates such variation.

In addition, the same adjustment principle can be applied to a differential pipeline stage; in such an instance it may be preferable to generate a single adjustment voltage $V_A$ that is shared between the two members of the differential circuit.

Recall from the discussion of FIGS. 3 and 4 that the conditional voltage transition $\Delta V_{QR1}$ which produces the conditional charge addition $C_6 \Delta V_{QR1}$ results from switching $V_{QR1}$ between two fixed voltages (47 and 48 in FIG. 4). This voltage difference constitutes the reference voltage $V_R$. A practical way of adding the adjustment voltage $V_A$ to $V_R$ is to insert a small adjustable voltage in series with either voltage 47 or voltage 48. One realistic implementation of the driver and adjustable voltage source, 8 and 9 in FIG. 11, is shown in FIG. 7.

Figure 11:
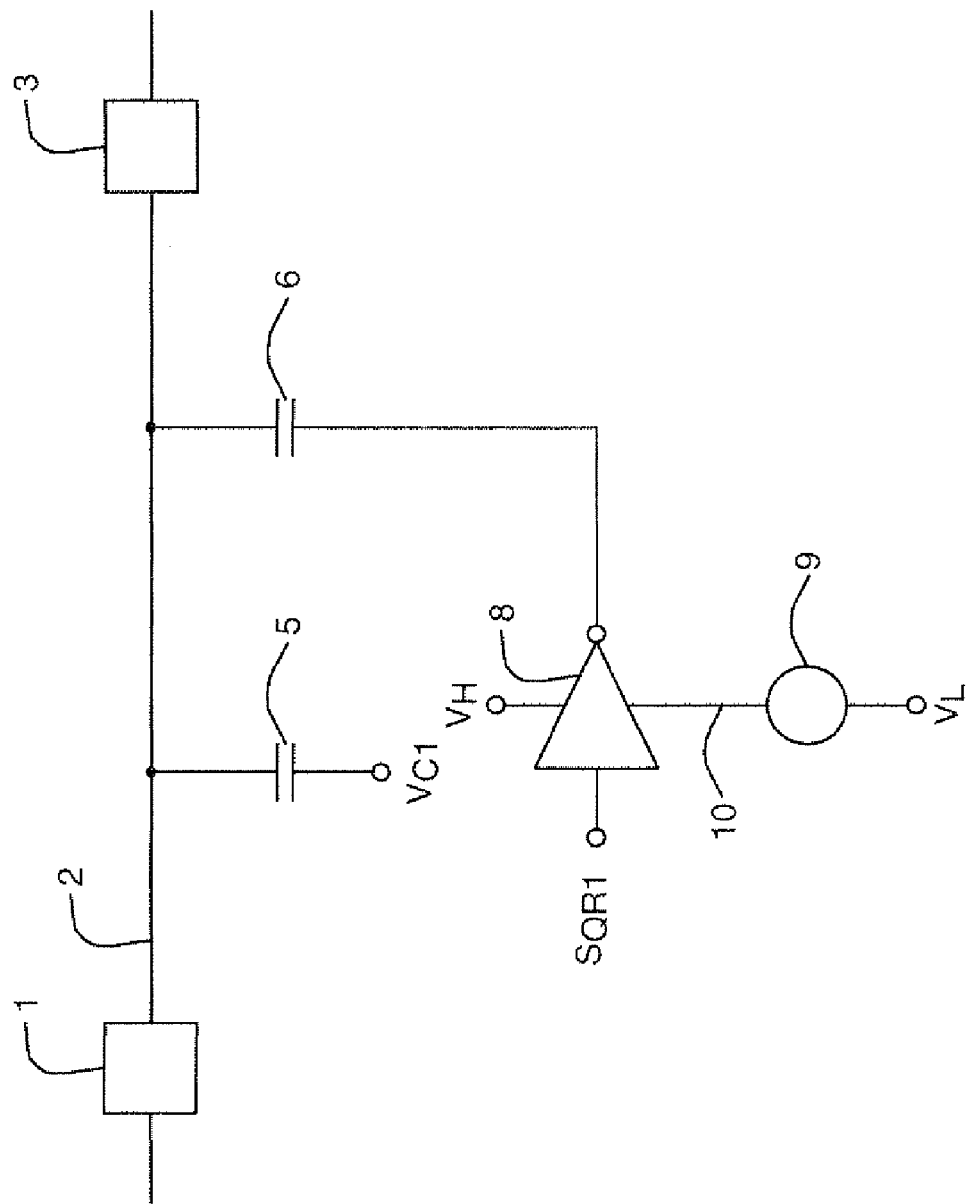
FIG. 11 shows the adjustment circuit connected to a pipeline stage.

FIG. 11 shows an example of a pipeline stage like that of FIG. 1 with such an adjustment voltage added. Pipeline elements 1, 2, 3, 5, and 6 are equivalent to those in FIG. 1. The added elements are a driver 8 for conditionally-switched capacitor 6, and an adjustable voltage source 9. The output of driver 8 switches between supplied voltage $V_8$ and the voltage at node 10 in response to a digital control signal $S_{QR1}$, thus providing the required conditional voltage transition. Thus $V_H$ and voltage 10 provide the voltages identified as 47 and 48 respectively in FIG. 4. Adjustable voltage source 9 adjusts the low voltage supplied to capacitor 6 as described above.

Figure 12:
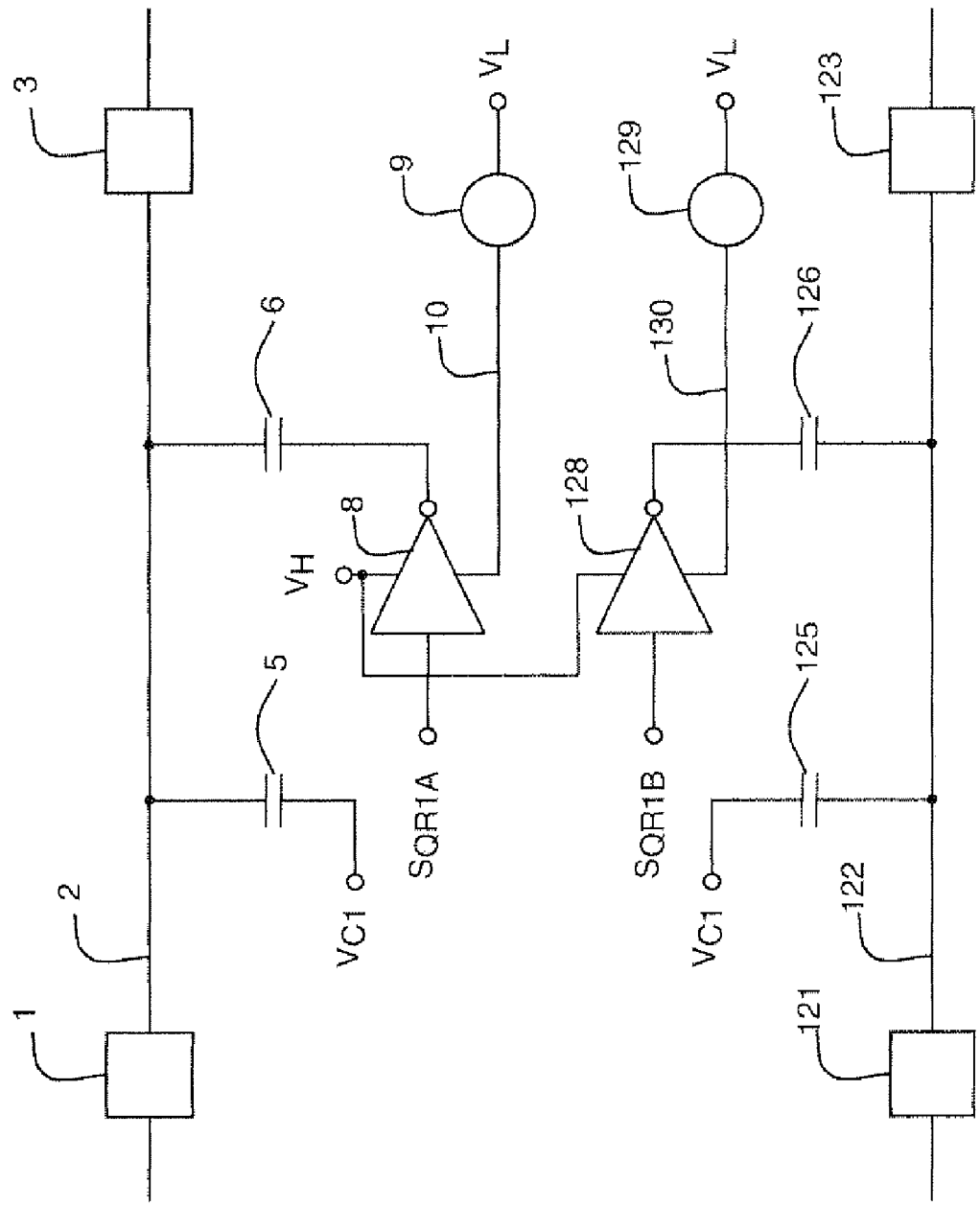
FIG. 12 is a more detailed view of a differential BBD-charge pipeline stage.

FIG. 12 shows a differential pipeline with similar function. Each member of the differential pair of pipeline nodes, 2 and 122, is provided with a conditionally-switched capacitor, 6 and 126 respectively. The voltage transitions driving capacitors 6 and 126 are provided by drivers 8 and 128, switching between $V_H$ and the voltages of nodes 10 and 130, in response to digital control signals $S_{QR1A}$ and $S_{QR1B}$, respectively. The voltages of nodes 10 and 130 are supplied by adjustable voltage sources 9 and 129 respectively. Nodes 10 and 130 may be connected to form a single node, and supplied by a single adjustable source such as 9.

Figure 7:
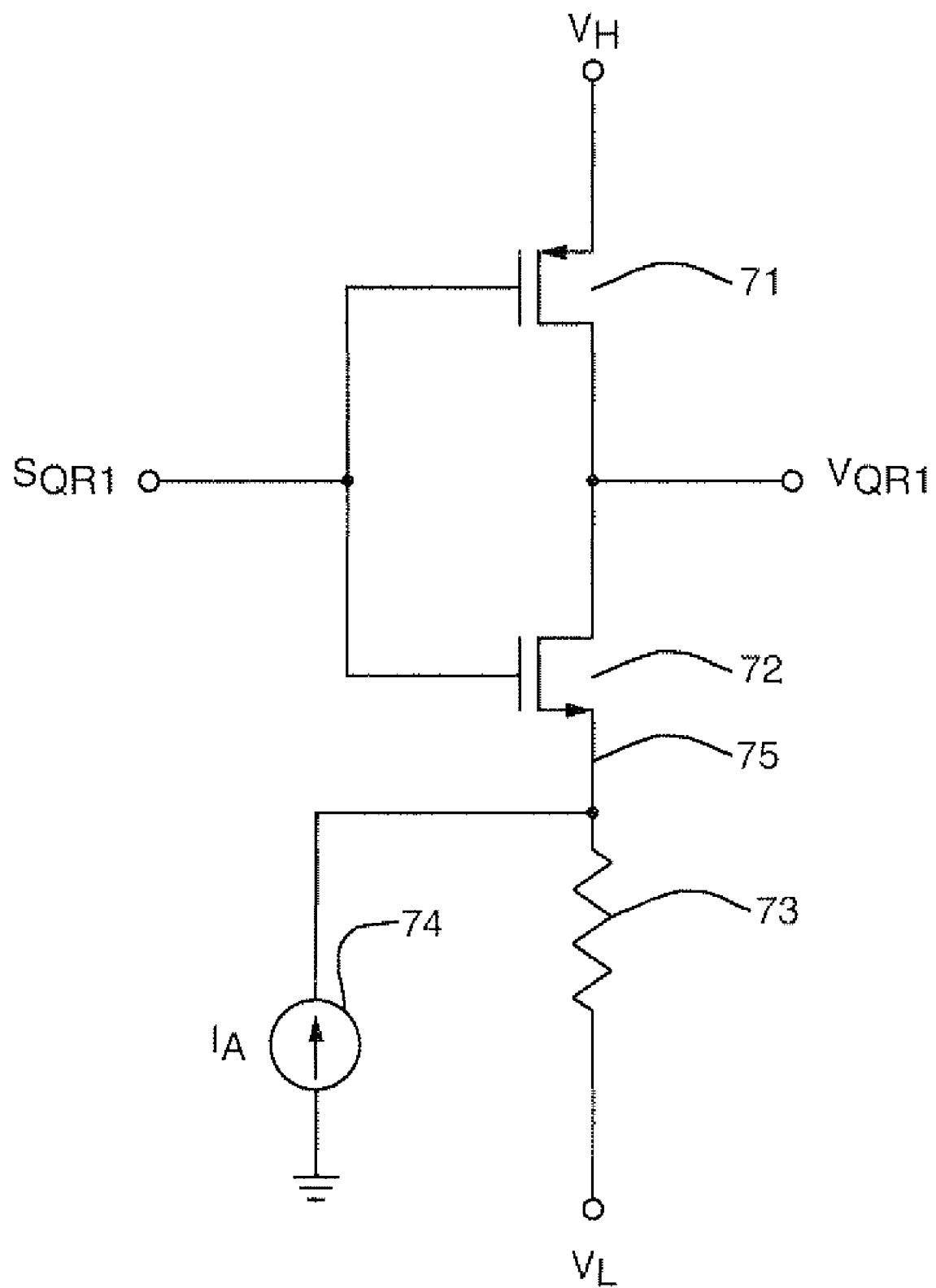
FIG. 7 shows a circuit diagram of a capacitor driver with an adjustable voltage transition.

FIG. 7 shows a CMOS inverter consisting of PFET 71 and NFET 72, supplied by fixed voltages $V_H$ and $V_L$. The NFET is connected to $V_L$ via resistor 73 at node 75. An adjustable current 74 is also connected to node 75. The inverter is driven by a logic signal $S_{QR1}$, and its output constitutes the voltage signal $V_{QR1}$ shown in FIG. 3.

Figure 8:
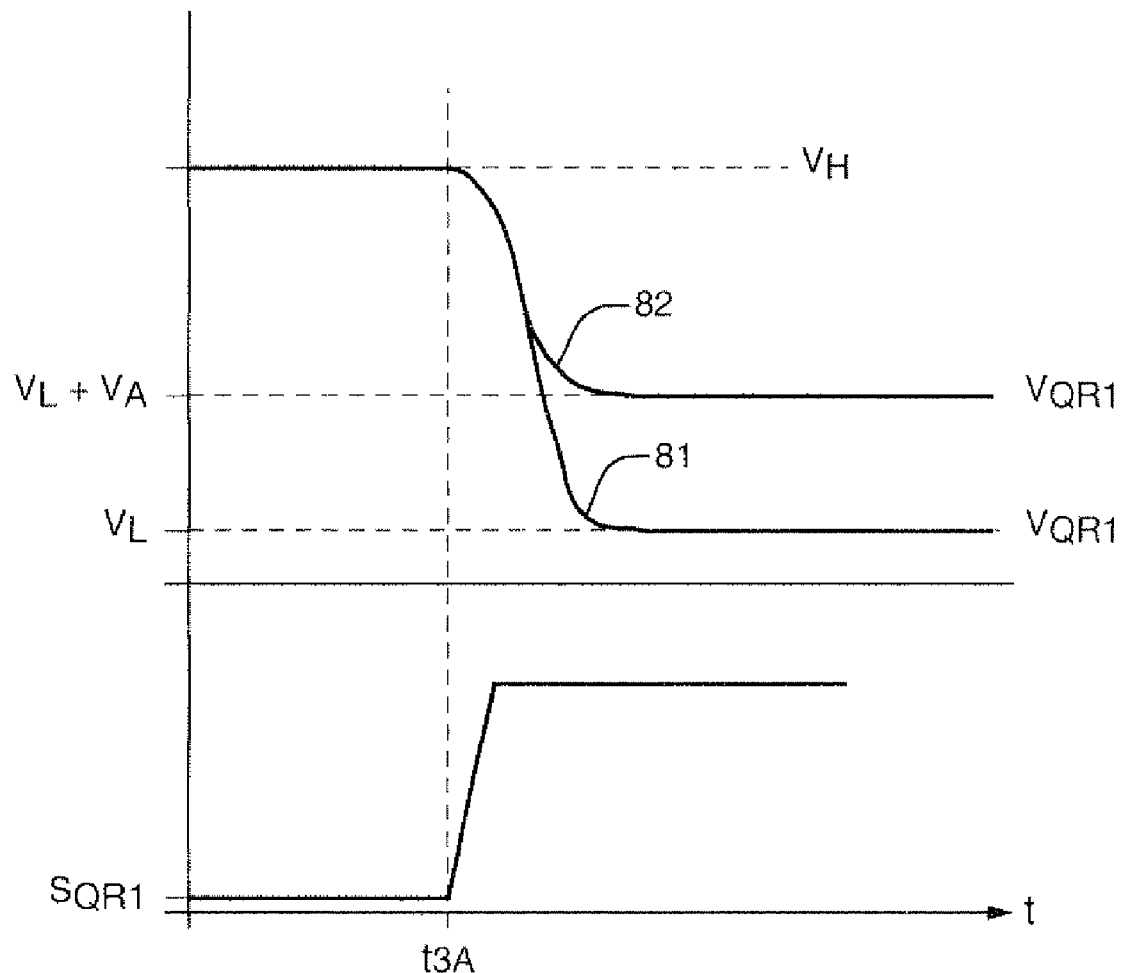
FIG. 8 illustrates voltage waveforms associated with FIG. 7.

FIG. 8 shows operating waveforms for the circuit of FIG. 7. At time $t_0$ logic signal $S_{QR1}$ is at a low state, turning PFET 71 on and NFET 72 off. Voltage $V_{QR1}$ is at an initial high value which is equal to $V_H$. At time $t_{3A}$ $S_{QR1}$ switches to a high logic state, turning FET 71 off and FET 72 on. FET 72 thus connects the output $V_{QR1}$ to node 75. If the adjustable current 74 is set to zero, then the series combination of FET 72 and resistor 73 charges $V_{QR1}$ towards $V_L$, as indicated by voltage curve 81 in FIG. 8. Since the load on this circuit consists only of a capacitor (capacitor 6 in FIG. 3), there is no DC current through FET 72 or resistor 73, so $V_{QR1}$ eventually settles to $V_L$. Thus the voltage transition of $V_{QR1}$ is $V_L - V_H$. This quantity constitutes the unadjusted reference voltage $V_R$.

If the current source 74 is adjusted to a non-zero value $I_A$, then the initial value of node 75 is $V_L + V_A = V_L + I_A R_{73}$, where $R_{73}$ is the value of resistor 73. (Note that FET 72 is initially off, so no current other than $I_A$ initially flows into resistor 73.) When $S_{QR1}$ changes state, then FET 72 turns on and connects the load capacitor to node 75, causing $V_{QR1}$ to charge downward along curve 82. At the end of this transition, current through FET 72 falls to zero and $V_{QR1}$ settles to final voltage $V_L + V_A$. Thus the voltage transition of $V_{QR1}$ is $V_L + V_A - V_H = V_R + V_A$. Adjustable current source 74, which is easily realizable in a practical circuit, thus provides for adjusting the size of the transition in $V_{QR1}$, as required. A similar circuit in which the resistor is placed in the source of PFET 71 instead of NFET 72 is equally practical. These circuits provide the necessary adjustment of $V_R$ with low power and small circuit area consumption.

As discussed in connection with Equations 11A and 12B, the required $V_A$ values have two components: one which corrects for a capacitor error and one which corrects for charge-transfer gain error. In the circuit of FIG. 7, the current source 74 can be made to consist of two independent sources in parallel, each controlled independently to correct for one of the errors. The combined currents sum to develop the composite $V_A$ value.

The capacitor-error component corrected by $V_A$ can be expected to be temperature-invariant because it is due primarily to geometric variation between capacitors, which occurs during circuit fabrication but does not generally change thereafter. Thus an adjustment voltage $V_A$ which tracks $V_R$ provides a temperature-stable adjustment. Creating a component of $V_A$ which tracks $V_R$ over temperature using circuits similar to FIG. 7 is straightforward in a conventional CMOS process. The value of this adjustment voltage can be set by a calibration process carried out during manufacturing test or upon powering-up the circuit, for example.

The second $V_A$ component corrects for charge-transfer gain error. This error depends on details of the charge-transfer circuits employed, and depends in general on both fabrication-process variation and on operating temperature. Known BBD charge-transfer circuits include both conventional (passive) ones and ones employing active circuitry, such as those described in a previous patent application by the same inventor entitled "Boosted Charge-Transfer Pipeline", U.S. patent application Ser. No. 11/807,914, filed May 30, 2007, which is hereby incorporated by reference in its entirety. These charge-transfer circuits exhibit both dynamic and static components of charge-transfer gain error. One aspect of the present invention provides for generating an adjustment-voltage component which tracks the static component of charge-transfer error.

In the discussion leading to Equations 3-6, the charge-transfer gain error was formulated in terms of the variation of charge-transfer-circuit input voltage with the amount of charge transferred. In that discussion the final value of the voltage $v_{43}$ at the input of the charge-transfer circuit was given as $v_{43} = v_{43N} + k Q_{OUT}$, with $v_{23N}$ the nominal value, and k a coefficient embodying the linear dependence on $Q_{OUT}$. This formulation encompasses both dynamic dependence of $v_{43}$ on $Q_{OUT}$ (due to incomplete settling) and static dependence. For the following discussion, it will be assumed that the dynamic effect is negligible, and the coefficient k reflects only static dependence.

It is known that the primary mechanism causing this static dependence is a voltage-feedback effect by which a voltage change at the charge-transfer circuit output causes its input voltage to change. As shown in FIG. 2, the output voltage of a charge transfer circuit is a function of the output charge; thus the causation giving rise to the coefficient k is:

output charge→output voltage change→input voltage change

If we denote the coefficient relating output voltage change to input voltage change:

$$\beta = dv_{IN}/dv_{OUT}$$

then the coefficient k relating output charge change to input voltage change is:

$$k = dv_{IN}/dQ_{OUT} = (dv_{IN}/dv_{OUT})(dv_{OUT}/dQ_{OUT}) = \beta dv_{OUT}/dQ_{OUT}$$

But $d(v_{OUT})/d(Q_{OUT})$ is simply the inverse of the capacitance at the charge-transfer circuit output node (which is equal to the node capacitance of the next pipeline stage). Defining that capacitance as $C_{OUT}$, we then have:

$$k=\beta/C_{OUT}$$

Referring again to FIGS. 3 and 4, we recall that the charge-transfer error $\epsilon$ was given, in terms of k and the storage-node capacitance $C_5+C_6$, as $\epsilon=(C_5+C_6)k$, leading to the expression:

$$\epsilon=(C_5+C_6)k=(C_5+C_6)\beta/C_{OUT}=\beta[(C_5+C_6)/C_{OUT}] \quad \text{Equation 13}$$

Thus the charge-transfer gain error $\epsilon$ depends on the voltage-feedback coefficient $\beta$ of the charge-transfer circuit and a ratio of pipeline node capacitances. Since the pipeline node-capacitance ratios are known by design within small tolerances (discussed above), the gain error value $\epsilon$ can be derived from a determination of the voltage-feedback coefficient $\beta$.

Figure 9:
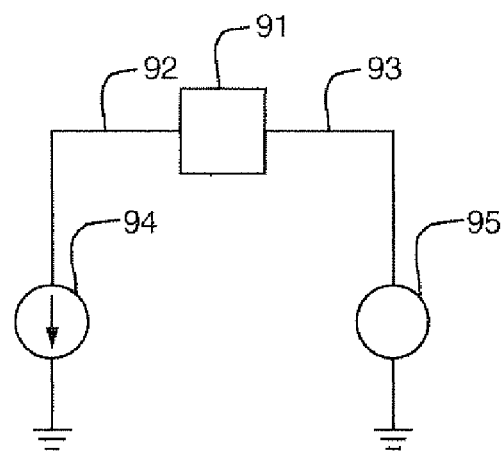
FIG. 9 shows a circuit diagram of a replica-based circuit for determining a charge-transfer voltage-feedback coefficient.

FIG. 9 shows a circuit which senses the voltage-feedback coefficient $\beta$. It consists of a charge-transfer circuit 91 with input node 92 and output node 93, a voltage source 95 connected to node 93, and a current source 94 connected to node 92. Charge-transfer circuit 91 is a replica of the charge-transfer circuits employed in the actual charge pipeline. Current source 94 is configured to sink from node 92 a small current which is typical of current levels near the end of the charge-transfer process described above. Voltage source 95 provides a voltage at node 93 which is in the range normally occurring at the output of the charge-transfer circuit at the end of the charge transfer process (such as voltage 42 in FIG. 4). Thus the charge-transfer circuit in FIG. 9 is biased in a static condition essentially like its instantaneous condition near the end of the normal (clocked) charge-transfer process.

Figure 10:
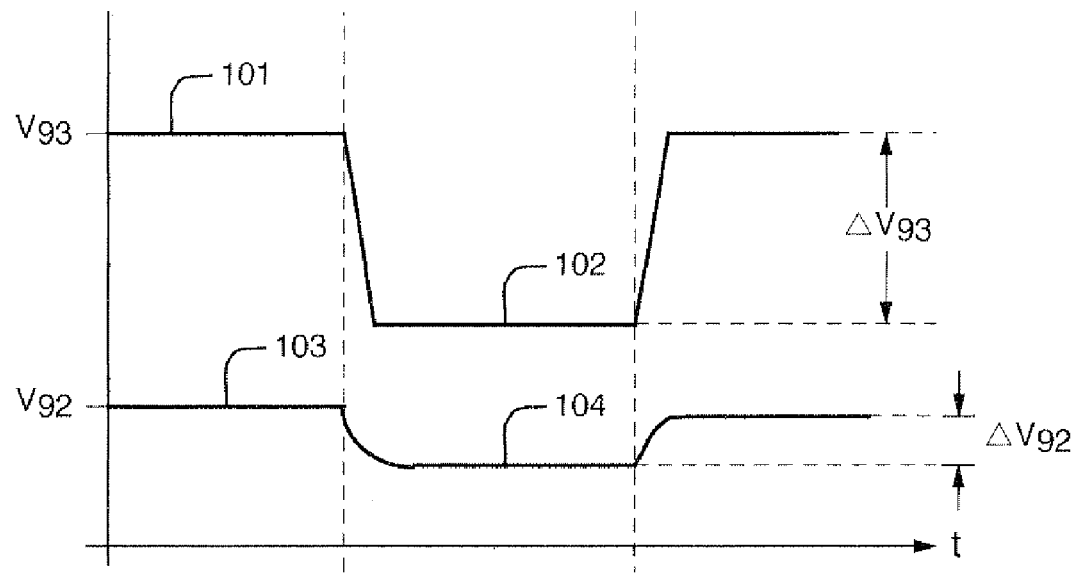
FIG. 10 illustrates voltage waveforms associated with FIG. 9.

FIG. 10 shows the voltages of the two nodes in FIG. 9. $V_{93}$, the voltage of node 93, is driven cyclically by voltage source 95 between two levels 101 and 102 differing by $\Delta V_{93}$. Due to the voltage-feedback effect discussed above, the input voltage of the charge-transfer circuit (i.e., the voltage $V_{92}$ at node 92) responds by changing between two levels 103 and 104, with difference $\Delta V_{92}$. By the definition above, these voltage changes are related as:

$$\Delta V_{92}=\beta\Delta V_{93}$$

Thus for a known (fixed) value of the drive voltage change $\Delta V_{93}$, $\Delta V_{92}$ provides a direct measure of $\beta$. Using the known-by-design values of $(C_5+C_6)/C_{OUT}$ and the reference voltage, the appropriate adjustment voltage ($V_{A2}$ in Equation 12B, for example) can be generated using known circuit techniques.

The voltage change $\Delta V_{92}$ can be converted to a DC voltage using phase-sensitive detection, since the alternating drive voltage $V_{93}$ is available as a reference. The frequency of this alternating voltage is not critical, and need not be as high as the sample rate of the charge pipeline, as the parameter being sensed changes only slowly (primarily due to chip temperature changes). Because of the low current at node 92, settling of $V_{92}$ in response to each $V_{93}$ transition is relatively slow, so the operating frequency of this circuit must be limited in order to obtain a valid settled value for $\Delta V_{92}$.

Alternatively, two circuits like that of FIG. 9, with differing DC voltages supplied by the output-node voltage sources, thus producing two different input-node voltages, can be used to directly generate a static (DC) value of $\Delta V_{92}$. The alternating-voltage method described above is generally more accurate, however, since $\Delta V_{92}$ is quite small (typically only a few mV or tens of mV).

In a practical charge pipeline, the charge-transfer circuits may not be of identical design at all stages. The $\beta$-sensing circuitry just described consumes very little power, and can practically be reproduced for each charge-transfer circuit design employed.

The circuitry described provides a correction voltage based on a charge-transfer circuit which is a replica of the charge transfer circuits in the pipeline. Such a replica-based method provides very good tracking over operating conditions, but typically has small initial mismatches. Such initial mismatches can be removed in a calibration operation, at manufacturing test or during circuit power-up for example. After the calibration, the replica-based circuit provides tracking of subsequent changes in operating conditions, including temperature and supply voltage.

Such an initial calibration step also (simultaneously) provides correction for any dynamic component of charge-transfer gain error which is present under the calibration conditions. Any change of this dynamic error with operating-condition changes (especially temperature) after calibration, however, is not corrected by the techniques of this invention.

While this invention has been particularly shown and described with references to example embodiments thereof, it will be understood by those skilled in the art that various changes in form and details may be made therein without departing from the scope of the invention encompassed by the appended claims.

What is claimed is:

1. A serial pipeline charge domain analog to digital converter (ADC) stage for converting an input charge to a digital representation thereof, the converter comprising:
   a first bucket brigade charge transfer circuit;
   a second bucket brigade charge transfer circuit;
   a node coupled to the first bucket brigade charge transfer circuit and the second bucket brigade charge transfer circuit;
   a clocked capacitor coupled to the node and to a clock signal;
   a conditionally-switched capacitor coupled to the node, the conditionally-switched capacitor also coupled to receive a conditional voltage having a reference voltage component and a transition voltage component; and
   an adjustment circuit, for adjusting the transition voltage component according to a gain error condition within the serial pipeline charge domain analog to digital converter circuit.

2. The apparatus of claim 1 wherein the gain error condition is non-optimum charge transfer gain.

3. The apparatus of claim 2 wherein the gain error condition is sub-unity charge transfer gain.

4. The apparatus of claim 2 wherein the conditional voltage also has a conditionally-added charge error component.

5. The apparatus of claim 1 wherein at least one of the first or second bucket brigade charge transfer circuits is a boosted charge transfer circuit.

6. The apparatus of claim 1 further comprising:
   a second serial pipeline analog-to-digital conversion stage that comprises:
   a third bucket brigade charge transfer circuit;
   a second node coupled to the second bucket brigade charge transfer circuit and to the third bucket brigade charge transfer circuit;
   a second clocked capacitor coupled to the second node and to a second clock signal;
   a second conditionally-switched capacitor coupled to the second node, the second conditionally-switched capacitor driven by a second conditional voltage having a second reference voltage component and a second transition voltage component; and a second adjustment circuit, for adjusting the second transition voltage according to a gain error condition in a preceding stage of the serial pipeline charge domain analog to digital converter circuit.

7. The apparatus of claim 6 wherein the second adjustment circuit adjusts the second transition voltage component according to a non-unity charge transfer gain between the first and second bucket brigade charge transfer circuits.

8. The apparatus of claim 1 wherein the adjustment circuit further comprises:
   an adjustable current source having an output node;
   a resistor, coupled between a reference voltage and the output node of the current source; and
   a switching Field Effect Transistor (FET) coupled between the output node of the adjustable current source and a note representing the transition voltage component.

9. The apparatus of claim 1 wherein the gain error condition is determined from a replica circuit for at least one of the first or second charge transfer circuits.

10. The apparatus of claim 1 wherein the adjustment circuit further comprises:
    two replica circuits having respective input and output terminals, coupled to two different direct current voltages at respective ones of their output terminals;
    a pair of current sources, for causing a predetermined current to flow to the input terminals of respective ones of the replica circuits; and
    a sensor, for sensing a voltage difference at the input terminals of the replica circuits.

11. A method for converting an input charge to digital representation in a serial pipeline charge domain analog to digital converter (ADC) stage, comprising:
    transferring charge to a first bucket brigade charge transfer circuit;
    transferring charge from the first bucket brigade charge transfer device to a second bucket brigade charge transfer circuit via a node;
    applying a clocked voltage to the node through a first capacitor;
    conditionally switching a second capacitor coupled to the node, the second capacitor coupled to a conditional voltage having a reference voltage component and a transition voltage component; and
    adjusting the transition voltage component according to a gain error condition within the serial pipeline charge domain analog to digital converter circuit.

12. The method of claim 11 wherein the gain error condition is non-optimum charge transfer gain.

13. The method of claim 12 wherein the gain error condition is sub-unity charge transfer gain.

14. The method of claim 12 wherein the conditional voltage also has a conditionally-added charge error component.

15. The method of claim 11 wherein at least one of the first or second bucket brigade charge transfer circuits is a boosted charge transfer circuit.

16. The method of claim 11, further comprising:
    transferring charge through a second serial pipeline analog-to-digital conversion stage via the steps of:
    transferring charge to a third bucket brigade charge transfer circuit via a second node coupled to the second bucket brigade charge transfer circuit and the third bucket brigade charge transfer circuit;
    applying a second clocked voltage node to the second node;
    conditionally switching a third capacitor coupled to the second node, the third capacitor driven by a second conditional voltage having a second reference voltage component and a second transition voltage component; and
    adjusting the second transition voltage according to a gain error condition in a preceding stage of the serial pipeline analog to digital converter circuit.

17. The method of claim 16 wherein the step of adjusting the second transition voltage component is according to non-unity charge transfer gain in two or more preceding pipeline stages.

18. The method of claim 11 wherein the adjusting step further comprises:
    switching a Field Effect Transistor (FET) coupled between an output node of an adjustable current source and a node representing transition voltage component.

19. The method of claim 11 wherein the gain error condition is inferred from a replica circuit for at least one of the first or second bucket brigade charge transfer circuits.

20. The method of claim 11 wherein the adjustment step further comprises:
    coupling two different direct current voltages at respective output terminals of two replica circuits;
    causing a predetermined current to flow to input terminals of respective ones of the replica circuits; and
    sensing a voltage difference at the input terminals of the replica circuits.

* * * * *